(12) United States Patent
Harada et al.

(10) Patent No.: US 10,825,964 B2
(45) Date of Patent: Nov. 3, 2020

(54) SEMICONDUCTOR LIGHT EMITTING DEVICE AND LIGHT TRANSMITTING MEMBER

(71) Applicant: STANLEY ELECTRIC CO., LTD., Tokyo (JP)

(72) Inventors: Mitsunori Harada, Tokyo (JP); Kaori Tachibana, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/193,900

(22) Filed: Nov. 16, 2018

(65) Prior Publication Data

US 2019/0157521 A1    May 23, 2019

(30) Foreign Application Priority Data

Nov. 17, 2017    (JP) ................. 2017-221499

(51) Int. Cl.
| | |
|---|---|
| *H01L 33/50* | (2010.01) |
| *H01L 33/24* | (2010.01) |
| *F21S 41/141* | (2018.01) |
| *H01L 25/075* | (2006.01) |
| *H01L 33/32* | (2010.01) |
| *H01L 33/06* | (2010.01) |
| *H01L 33/38* | (2010.01) |
| *H01L 33/62* | (2010.01) |

(52) U.S. Cl.
CPC .......... *H01L 33/505* (2013.01); *F21S 41/141* (2018.01); *H01L 33/24* (2013.01); *H01L 33/507* (2013.01); *H01L 25/0753* (2013.01); *H01L 33/06* (2013.01); *H01L 33/325* (2013.01); *H01L 33/38* (2013.01); *H01L 33/62* (2013.01); *H01L 2933/0041* (2013.01)

(58) Field of Classification Search
CPC ..................................................... H01L 33/505
USPC ............................................................ 257/98
See application file for complete search history.

(56) References Cited

U.S. PATENT DOCUMENTS

| | | | |
|---|---|---|---|
| 2004/0076016 A1* | 4/2004 | Sato | ........................ H01L 33/20 362/555 |
| 2004/0160783 A1* | 8/2004 | Tatsukawa | ............... B60Q 1/04 362/507 |
| 2007/0035813 A1* | 2/2007 | Roth | ................... C09K 11/0844 359/350 |

(Continued)

FOREIGN PATENT DOCUMENTS

| | | |
|---|---|---|
| JP | 2014-143300 A | 8/2014 |
| JP | 5837456 B2 | 12/2015 |

*Primary Examiner* — Jami Valentine Miller
(74) *Attorney, Agent, or Firm* — Kenealy Vaidya LLP

(57) ABSTRACT

A high-quality semiconductor light emitting device is provided, which include: a semiconductor light emitting element; and a light transmitting member disposed on or above the semiconductor light emitting element and including a wavelength conversion material at least in part. The light transmitting member includes: a first portion having side surfaces all being a vertical surface; a second portion disposed on the first portion and including an inclined surface on at least part of the side surfaces; and a third portion disposed on the second portion and having side surfaces all being a vertical surface. The third portion has an upper surface of which a size is smaller than a size of a lower surface of the first portion.

26 Claims, 11 Drawing Sheets

(56) References Cited

U.S. PATENT DOCUMENTS

| | | | | |
|---|---|---|---|---|
| 2007/0114551 A1* | 5/2007 | Kawaguchi | ............... | F21K 9/00 |
| | | | | 257/98 |
| 2008/0116473 A1* | 5/2008 | Sugiyama | ............. | H01L 33/483 |
| | | | | 257/98 |
| 2009/0262517 A1* | 10/2009 | Suehiro | ................ | G02B 6/0023 |
| | | | | 362/84 |
| 2013/0313581 A1 | 11/2013 | Furuyama et al. | | |
| 2014/0203306 A1 | 7/2014 | Ito | | |

* cited by examiner

SEMICONDUCTOR LIGHT EMITTING DEVICE AND LIGHT TRANSMITTING MEMBER

This application claims the priority benefit under 35 U.S.C. § 119 of Japanese Patent Application No. 2017-221499 filed on Nov. 17, 2017, which is hereby incorporated in its entirety by reference.

TECHNICAL FIELD

The presently disclosed subject matter relates to a semiconductor light emitting device.

BACKGROUND ART

A technique of a semiconductor light emitting device in which a wavelength conversion layer is disposed on a semiconductor light emitting device has been known, for example, as those disclosed in Japanese Patent No. 5837456 (corresponding US2013313581A1).

In the semiconductor light emitting device described in Japanese Patent No. 5837456, the side surface of the wavelength conversion layer is tapered so that the upper surface is smaller than the lower surface.

A transparent member may be disposed on the wavelength conversion layer as disclosed in Japanese Patent Application Laid-Open No. 2014-143300 (corresponding to US2014203306A1).

Japanese Patent Application Laid-Open No. 2014-143300 discloses an invention of a semiconductor light emitting device in which a transparent member having a tapered side surface is disposed on a wavelength conversion layer having a fillet portion.

In the semiconductor light emitting device described in Japanese Patent No. 5837456, if the inclination of the side surface of the wavelength conversion layer is made small with respect to the horizontal plane (the upper surface size of the wavelength conversion layer is made small), when a light reflecting member is disposed on the side surfaces of the semiconductor light emitting element and the wavelength conversion layer, the light reflecting member is likely to overlap the upper surface of the wavelength conversion layer.

In the semiconductor light emitting device described in Japanese Patent Application Laid-Open No. 2014-143300, since the wavelength conversion layer has a fillet structure, the amount of the wavelength conversion material (for example, phosphor) on the side surface of the semiconductor light emitting device is larger than that on the upper surface of the device. As a result, color unevenness occurs at the edge of the light emitting region. In addition, in the first and fifth embodiments of the publication, since the inclined portion and the lower surface of the transparent member have a sharp shape, burrs are apt to be generated and the stability of the shape is apt to be impaired.

SUMMARY

The presently disclosed subject matter was devised in view of these and other problems and features and in association with the conventional art. According to an aspect of the presently disclosed subject matter, a high-quality semiconductor light emitting device can be provided.

According to another aspect of the presently disclosed subject matter, a semiconductor light emitting device can include: a semiconductor light emitting element; and a light transmitting member disposed on or above the semiconductor light emitting element and including a wavelength conversion material at least in part, the light transmitting member comprising: a first portion having side surfaces all being a vertical surface; a second portion disposed on the first portion and having side surfaces at least part of which includes an inclined surface; and a third portion disposed on the second portion and having side surfaces all being a vertical surface, wherein the third portion has an upper surface of which a size is smaller than a size of a lower surface of the first portion.

Herein, a reference direction (Z axis direction in the drawings) is directed from the semiconductor light emitting element toward the light transmitting member while substantially vertical to the upper surface of the semiconductor light emitting element (and the light transmitting member). Thus, the direction "vertical" is parallel to this direction while the "up (upper)" and "low (lower)" mean the relative positions in the reference direction.

In the semiconductor light emitting device with the above configuration, the semiconductor light emitting element can include a light emitting layer disposed in a disposition region having a contour with a shape and a size, and the first portion of the light transmitting member can have the lower surface of which a shape and the size are equivalent to the shape and the size of the contour of the disposition region of the light emitting layer of the semiconductor light emitting element when viewed in a plan view.

In the semiconductor light emitting device with the above configuration, the semiconductor light emitting element can include a light emitting portion disposed in a disposition region having a contour with a size. Herein, the size of the lower surface of the first portion of the light transmitting member can be larger than the size of the contour of the disposition region of the light emitting portion of the semiconductor light emitting element, and the size of the upper surface of the third portion of the light transmitting member can be smaller than the size of the contour of the disposition region of the light emitting portion of the semiconductor light emitting element. Furthermore, the light transmitting member can be disposed on the semiconductor light emitting element via a transparent adhesive layer, and the transparent adhesive layer can be formed so as to be connected from a portion between the semiconductor light emitting element and the light transmitting member to a side surface of the semiconductor light emitting element, to thereby form a fillet portion in a region of the side surface of the semiconductor light emitting element.

In the semiconductor light emitting device with the above configuration, the light transmitting member can include a light transmissive member and a wavelength conversion layer disposed on a lower surface of the light transmissive member, the light transmissive member can be composed by the second portion and the third portion, and the wavelength conversion layer can be composed by at least a part of the first portion.

In the semiconductor light emitting device with the above configuration, the second portion of the light transmitting member can have side surfaces opposite to each other and inclined at mutually different inclination angles. Furthermore, the light transmitting member can have side surfaces of which a part is a vertical surface.

According to still another aspect of the presently disclosed subject matter, a semiconductor light emitting device can include: a semiconductor light emitting element; and a light transmitting member disposed on or above the semiconductor light emitting element, the light transmitting member being configured to include a wavelength conversion material at least in part, the light transmitting member comprising: a first portion having side surfaces all being a vertical surface; a second portion disposed on the first portion and having side surfaces at least part of which includes a curved surface curved inwardly of the light transmitting member; and a third portion disposed on the second portion and having side surfaces continuous with the side surfaces of the second portion, all the side surfaces being closer to a vertical surface than the side surfaces of the second portion. In this semiconductor light emitting device, the third portion has an upper surface of which a size is smaller than a size of a lower surface of the first portion.

The semiconductor light emitting device with the above-described configurations can be a high-quality semiconductor light emitting device, and may be used as a light source for use in a headlamp of an automobile.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

Figure 1A:
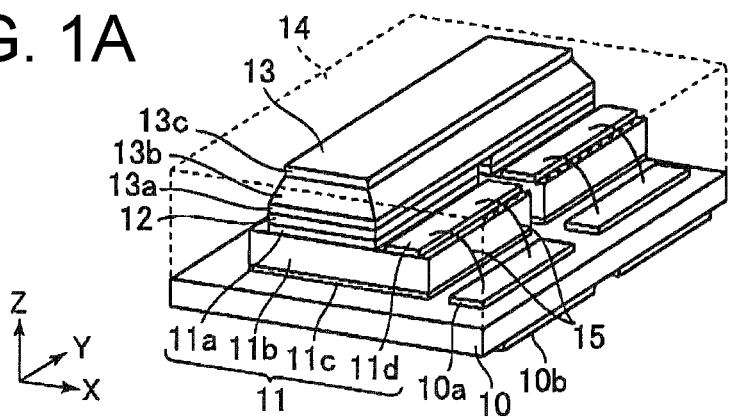
FIGS. 1A and 1B are a schematic perspective view and a cross-sectional view, respectively, of a semiconductor light emitting device according to a first exemplary embodiment made in accordance with principles of the presently disclosed subject matter.

A description will now be made below to semiconductor light emitting devices of the presently disclosed subject matter with reference to the accompanying drawings in accordance with exemplary embodiments.

The coordinate system can be defined by an orthogonal coordinate system including an X(axis) direction, a Y(axis) direction, and a Z(axis) direction as illustrated in the drawings, and accordingly, the aforementioned reference direction corresponds to the Z axis direction. Thus, the phrase "when viewed in a plan view" used herein means that an object is observed in the Z axis direction from above.

Figure 1B:
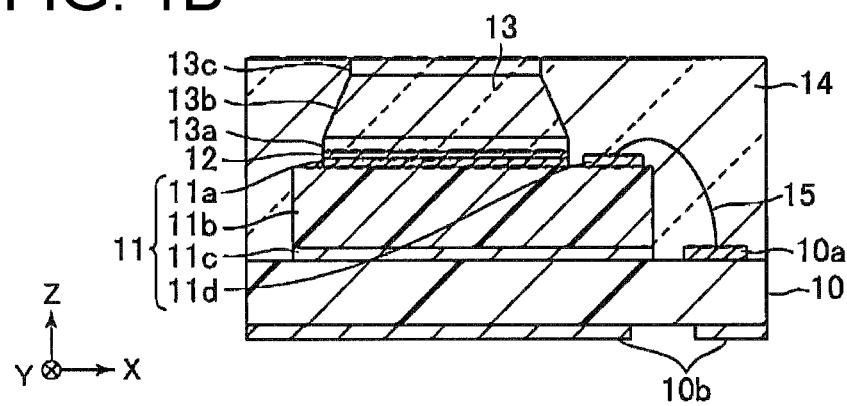

FIGS. 1A and 1B are a schematic perspective view and a cross-sectional view, respectively, of a semiconductor light emitting device according to a first exemplary embodiment made in accordance with the principles of the presently disclosed subject matter. Herein, the cross-sectional view is made along the X axis direction.

The semiconductor light emitting device according to the first exemplary embodiment can include a mounting substrate 10, a light emitting diode (LED) element 11 disposed on or above the mounting substrate 10, a phosphor ceramic plate 13 disposed on or above the LED element 11, and a light reflecting member 14.

The mounting substrate 10 may be formed of a ceramic such as AlN. A power feeding pad 10a may be provided on the front surface of the mounting substrate 10, and a back surface wiring 10b may be provided on the back surface thereof.

The LED element 11 may be an LED element of a top emission type in which, for example, a rectangular semiconductor layer 11a is bonded to an upper surface of an Si substrate 11b (supporting substrate), for example. On the upper surface of the Si substrate 11b, a power feeding portion 11d may be formed at a position different from the position where the semiconductor layer 11a is disposed. A back metal layer 11c may be formed on the lower surface.

The semiconductor layer 11a may be configured to include, in order from the Si substrate 11b side, a p-type semiconductor layer formed of p-type GaN doped with Mg or the like, an active layer (light emitting layer) having a multiquantum well structure including a well layer formed of InGaN and a barrier layer formed of GaN, and an n-type semiconductor layer formed of n-type GaN doped with Si or the like.

The LED element 11 may further include a p-side electrode configured to be electrically connected to the p-type semiconductor layer and an n-side electrode configured to be electrically connected to the n-type semiconductor layer. The p-side electrode and the n-side electrode may be disposed between the Si substrate 11b and the semiconductor layer 11a, for example.

In the first exemplary embodiment, a plurality of (two) LED elements 11 are disposed (die-bonded) on the mounting substrate 10 in the Y-axis direction. The power supply unit 11d is configured to be electrically connected to the power supply pad 10a of the mounting substrate 10 by wire bonding using a wire 15.

By supplying a current to the semiconductor layer 11a, blue light is emitted from the LED element 11, i.e., the semiconductor layer 11a serving as a light emitting layer portion.

The phosphor ceramic plate 13 can be bonded to an upper portion of the LED element 11 using a transparent adhesive 12.

Figure 1C:
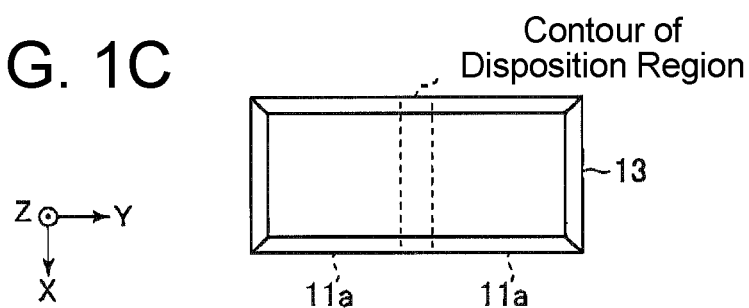
FIG. 1C is a schematic plan view illustrating the contour of the disposition region of a phosphor ceramic plate 13 and a semiconductor layer 11a of two LED elements 11.

The phosphor ceramic plate 13 may be formed from a light transmissive wavelength conversion member made of, for example, alumina and YAG (Yttrium Aluminum Garnet, $Y_3Al_5O_{12}$) phosphor material by high-temperature firing. As shown in FIG. 1C, the shape and size of the lower surface of the phosphor ceramic plate 13 are equivalent to those of the contour of the disposition region of the semiconductor layers 11a (light emitting layers) of the two LED elements 11 (a rectangle defined by the light emitting layer portions of the two LED elements 11) when viewed in a plan view (when viewed from the Z-axis positive direction). The upper surface of the phosphor ceramic plate 13 can have, for example, a rectangular shape, and the size thereof can be smaller than the size of the contour of the disposition region of the semiconductor layers 11a of the two LED elements 11.

The phosphor ceramic plate 13 can be positioned so that its lower surface coincides with the contour of the disposition region of the semiconductor layers 11a of the two LED elements 11 when viewed in a plan view.

The blue light emitted from the LED element 11 can enter the phosphor ceramic plate 13 from the lower surface thereof. Part of the blue light incident on the phosphor ceramic plate 13 can enter the phosphor material to be converted into light of a different wavelength (e.g., yellow light), and be emitted to the outside from the upper surface of the phosphor ceramic plate 13 (light emitting surface of the semiconductor light emitting device) together with another part of blue light which has not been incident on the phosphor material. Thus, white light can be obtained by yellow light which has been incident on the phosphor material and emitted from the phosphor ceramic plate 13 after wavelength conversion, and blue light which has exited from the phosphor ceramic plate 13 without entering the phosphor material (without wavelength conversion).

The light reflecting member 14 can be disposed so as to cover the side surfaces of the LED element 11s and the phosphor ceramic plate 13, and have a function of sealing the LED elements 11, the phosphor ceramic plate 13, and the like, as well as a light reflection function. Of the light having entered the phosphor ceramic plate 13, the light that has traveled to the side surfaces of the phosphor ceramic plate 13 can be reflected by the interface between the side surface of the phosphor ceramic plate 13 and the light reflecting member 14. The height of the upper surface of the light reflecting member 14 is equal to the height of the upper surface of the phosphor ceramic plate 13.

The light reflecting member 14 may be formed from, for example, a resin containing a powder of a material that can reflect light. Examples of the material that can reflect light may include titanium oxide, zinc oxide, alumina, and the like white filler. Examples of the resin used may include curable resins such as a silicone resin and an epoxy resin.

The light reflecting member 14 can suppress light leakage from a portion other than the upper surface of the phosphor ceramic plate 13, i.e., the light emitting surface of the semiconductor light emitting device. In addition, the light extraction efficiency of the semiconductor light emitting device can be improved.

A description will next be given of the phosphor ceramic plate 13 in detail.

The phosphor ceramic plate 13 can be configured to include, in order from the LED element 11 side, a rectangular parallelepiped portion (vertical portion) having vertical surfaces 13a as four side surfaces, a truncated quadrangular pyramid portion (inclined portion) having inclined surfaces 13b as four side surfaces, and a rectangular parallelepiped portion (vertical portion) having vertical surfaces 13c as four side surfaces. The vertical surfaces 13a and 13c are vertical side surfaces that erect (extend) vertically (Z-axis positive direction) from the lower surface, and the inclined surfaces 13b are inclined side surfaces that erect (extend) from the lower surface while being inclined inward (center side of the phosphor ceramic plate 13) at a predetermined angle.

As described above, the shape and size of the lower surface of the rectangular parallelepiped portion having the vertical surfaces 13a as side surfaces are equivalent to those of the contour of the disposition region of the semiconductor layers 11a of the two LED elements 11 when viewed in a plan view. The size of the upper surface of the rectangular parallelepiped portion having the vertical surfaces 13c as side surfaces is smaller than the size of the contour of the disposition region of the semiconductor layers 11a of the two LED elements 11.

The semiconductor light emitting device according to the first exemplary embodiment, in the vicinity of the lower surface of the phosphor ceramic plate 13, is provided with the vertical portion (the rectangular parallelepiped portion having the side surfaces erecting (extending) perpendicular to the light emitting surfaces of the LED elements 11) having a shape and size equivalent to the disposition region of the semiconductor layers 11a of the two LED elements 11, so that the light emitted by the LED element 11 can be introduced into the phosphor ceramic plate 13 with high efficiency.

In addition, since the phosphor ceramic plate 13 is provided with the inclined portions, i.e., a truncated quadrangular pyramid portion having the inclined surfaces 13b as side surfaces, the upper surface of the phosphor ceramic plate 13 becomes smaller than the lower surface. The light emitted by the LED elements 11 and introduced into the phosphor ceramic plate 13 can travel straight, or be reflected at the interface between the inclined surface 13b and the light reflecting member 14, so as to travel toward the upper surface of the phosphor ceramic plate 13. Since the size of the upper surface of the phosphor ceramic plate 13, i.e., the size of the light emitting surface of the semiconductor light emitting device, is smaller than the size of the lower surface, the luminance of the light emitted from the semiconductor light emitting device can be improved. In the semiconductor light emitting device according to the first exemplary embodiment, the size of the light emitting surface of the semiconductor light emitting device can be reduced without reducing the size of the LED element, and high luminance can be realized. The semiconductor light emitting device which emits light with high luminance can be suitably used for a headlamp for an automobile, for example. In addition, since the size of the light emitting surface is small, the semiconductor light emitting device according to the first exemplary embodiment can be suitably used for a headlamp for an automobile also from the viewpoint of miniaturizing the components of the optical system including the lens.

Further, in manufacturing the semiconductor light emitting device according to the first exemplary embodiment, after the LED elements 11 are mounted on the mounting substrate 10 by die bonding and wire bonding, the phosphor ceramic plate 13 can be bonded on or above the LED elements 11 using the transparent adhesive 12. After that, for example, a frame material may be disposed around the mounting substrate 10, and a liquid resin material such as a resin material containing a powder of a light-reflecting material may be injected into the inside of the frame material, followed by curing the resin material, to thereby form the light-reflecting member 14.

In the semiconductor light emitting device according to the first exemplary embodiment, since the vertical portion (the rectangular parallelepiped portion having the vertical surfaces 13c as side surfaces) is provided in the vicinity of the upper surface of the phosphor ceramic plate 13, when the light reflecting member 14 is formed on the side surfaces by filling and curing the liquid resin material, the height of the liquid material can be reliably controlled to the height of the upper surface of the phosphor ceramic plate 13, and the liquid material can be prevented from covering the upper surface of the phosphor ceramic plate 13. In the semiconductor light emitting device manufactured, the height of the upper surface of the light reflecting member 14 can be equal to the height of the upper surface of the phosphor ceramic plate 13, so that the stability of the shape and size of the semiconductor light emitting device can be realized.

The vertical portion in the vicinity of the upper surface of the phosphor ceramic plate 13 can also contribute to suppression of bleeding of outgoing light of the semiconductor light emitting device.

For example, in the case of a phosphor ceramic plate having a region in which the inclined surface and the horizontal surface are continuous, when the phosphor ceramic plate is manufactured, for example, a variation in size or the like, for example, in the upper surface size is likely to occur due to wear of a dicing blade. In addition, burrs tend to occur. On the other hand, the vertical portions in the vicinity of the upper surface and the lower surface of the phosphor ceramic plate 13 can be controlled to a desired shape and size by, for example, cutting by a dicing blade, a laser, or the like. The variation in size due to the wear of the dicing blade can be prevented by changing the pitch. Since the instability of the shape and size of the phosphor ceramic plate 13 is suppressed, the stability of the shape and size of the semiconductor light emitting device can be improved.

Thus, the semiconductor light emitting device of the first exemplary embodiment can have a high quality.

Although the first exemplary embodiment is configured as the semiconductor light emitting device in which one phosphor ceramic plate 13 is disposed on a plurality (two) of LED elements 11 mounted on the mounting substrate 10, a single LED element 11 may be mounted on the mounting substrate 10 (chip size package). In this case, the shape and size of the lower surface of the phosphor ceramic plate 13 are made equal to the planar shape and the planar size of the semiconductor layer 11a (light emitting layer) of the LED element 11, i.e., the shape and size of the lower surface of the phosphor ceramic plate 13 are made equal to the shape and size of the contour of the disposition region of the light emitting layer of the single LED element 11. Furthermore, the size of the upper surface of the phosphor ceramic plate 13 is made smaller than the planar size of the semiconductor layer 11a (the light emitting layer) of the LED element 11, i.e., the size of the upper surface of the phosphor ceramic plate 13 is made smaller than the size of the contour of the disposition region of the light emitting layer of the single LED element 11. Further, the phosphor ceramic plate 13 is positioned so that the lower surface thereof coincides with the semiconductor layer 11a (light emitting layer) of the LED element 11 when viewed in a plan view.

In the semiconductor light emitting device according to the first exemplary embodiment, another wavelength conversion member (a light transmitting member containing a wavelength conversion material) may be used in place of the phosphor ceramic plate 13.

Figure 2A:
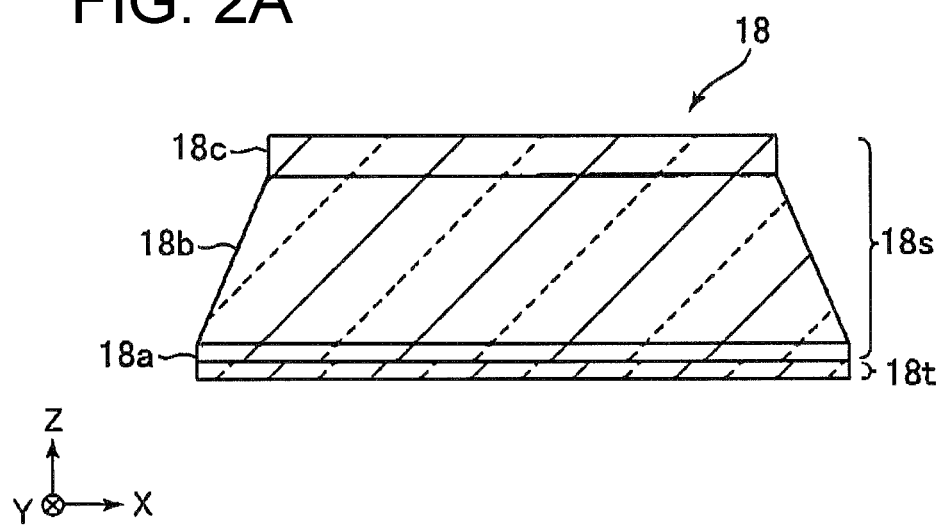
FIG. 2A is a schematic cross-sectional view illustrating a wavelength conversion member 18.

FIG. 2 is a schematic cross-sectional view illustrating another example of the wavelength conversion member (wavelength conversion member 18).

The shape of the wavelength conversion member 18 can have the same characteristics as those of the phosphor ceramic plate 13. That is, the lower surface of the wavelength conversion member 18 can have the same contour, shape, and size (rectangular shape having the same size) of the disposition region of the semiconductor layers 11a (light emitting layers) of the two LED elements 11. The upper surface of the wavelength conversion member 18 can have a rectangular shape having a size smaller than the size of the contour of the disposition region of the semiconductor layers 11a (light emitting layers) of the two LED elements 11. Further, the wavelength conversion member 18 can also be configured to include a rectangular parallelepiped portion (vertical portion) having vertical surfaces 18a as four side surfaces, a truncated quadrangular pyramid portion (inclined portion) having inclined surfaces 18b as four side surfaces, and a rectangular parallelepiped portion (vertical portion) having vertical surfaces 18c as four side surfaces. The wavelength conversion member 18 can also be positioned so that its lower surface coincides with the contour of the disposition region of the semiconductor layers 11a of the two LED elements 11 when viewed in a plan view.

The wavelength conversion member 18 can be configured to include a light transmissive member 18s and a wavelength conversion layer 18t disposed on the lower surface of the light transmissive member 18s. The wavelength conversion member 18 may be a translucent member including a wavelength conversion material in a part of the wavelength conversion layer 18t.

The light transmissive member 18 is formed of, for example, glass. The light transmissive member 18 may be formed of another light transmissive material such as sapphire. The wavelength conversion layer 18t may be, for example, a phosphor layer containing a YAG phosphor material as a wavelength conversion material. As an example, the wavelength conversion member 18 having an inorganic phosphor layer 18t having a thickness of 20 μm to 30 μm can be produced through a step of firing a slurry layer obtained by printing a mixture of an inorganic binder and a YAG phosphor material on one surface of a heat-resistant glass substrate.

In the wavelength conversion member 18, the rectangular parallelepiped portion (vertical portion) having the vertical surfaces 18a as four side surfaces can be composed of a part of the light transmissive member 18s and the wavelength conversion layer 18t, and the truncated quadrangular pyramid portion (inclined portion) having the inclined surfaces 18b as four side surfaces, and the rectangular parallelepiped portion (vertical portion) having the vertical surfaces 18c as four side surfaces can be composed of another part of the light transmissive member 18s.

A semiconductor light emitting device using the wavelength conversion member 18 in place of the phosphor ceramic plate 13 can also exhibit the same effects as those of the first exemplary embodiment. Furthermore, the wavelength conversion layer 18t can have a high density, so that light with high luminance can be emitted, while the light can be diffused and/or reflected within the light transmissive member 18s formed of glass or sapphire advantageously.

Figure 2B:
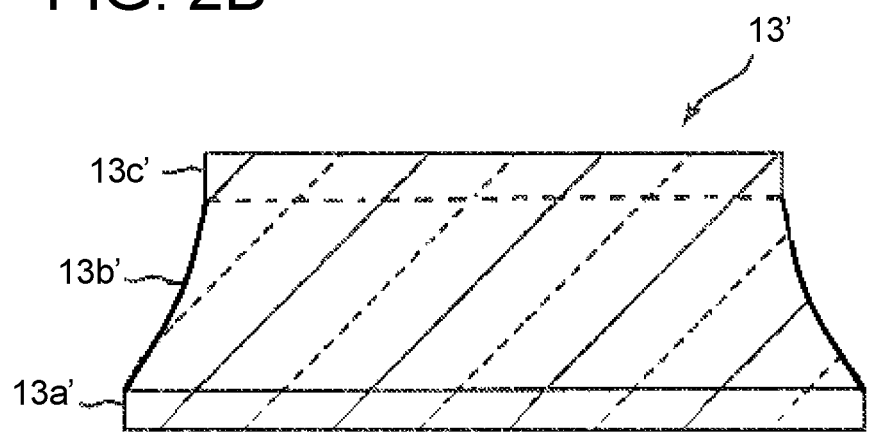
FIG. 2B is a schematic cross-sectional view illustrating a modified example of the phosphor ceramic plate 13 (as 13')

FIG. 2B shows a modified example of the phosphor ceramic plate 13 illustrated as a phosphor ceramic plate 13', which can have features similar to those of the phosphor ceramic plate 13. In other words, the lower surface of the phosphor ceramic plate 13' has the same shape and size as the contour of the disposition region of the semiconductor layer 11a (light emitting layer) of the LED element 11 arranged thereunder (rectangular shape having the same size). In addition, the upper surface of the phosphor ceramic plate 13' has a rectangular shape smaller than the size of the contour of the disposition region of the semiconductor layer 11a (light emitting layer) of the LED element 11 disposed thereunder. The phosphor ceramic plate 13' is also disposed so as to be aligned with the contour of the disposition region of the semiconductor layer 11a of the LED element 11 thereunder, when viewed in a plan view.

Portions of the phosphor ceramic plate 13' corresponding to the vertical surfaces 13c and the inclined surfaces 13b of the phosphor ceramic plate 13 are formed to be continuous surfaces in the phosphor ceramic plate 13'. For the sake of convenience, FIG. 2B shows them as a vertical surface 13c' and an inclined surface 13b'. In this modified example, the side surfaces, or the vertical surfaces 13c' and the inclined surfaces 13b' are not planar but curved surfaces curved inwardly of the phosphor ceramic plate 13'. Specifically, the vertical surfaces 13c', that is, the portions in the vicinity of the upper end of the side surface of the phosphor ceramic plate 13' are shaped to be closer to the vertical surface than the inclined surfaces 13b', that is, the portions near the center of the side surface of the phosphor ceramic plate 13'.

The semiconductor light emitting device using the phosphor ceramic plate 13' instead of the phosphor ceramic plate 13 can also exhibit the same effects as those of the first exemplary embodiment.

Figure 3A:
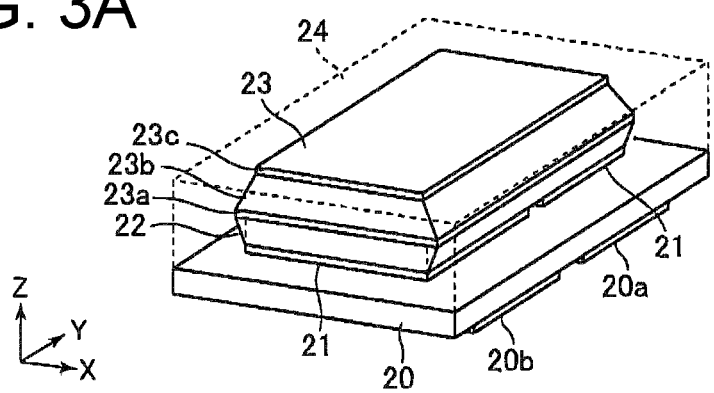
FIGS. 3A and 3B are a schematic perspective view and a cross-sectional view, respectively, of a semiconductor light emitting device according to a second exemplary embodiment.
Figure 3B:
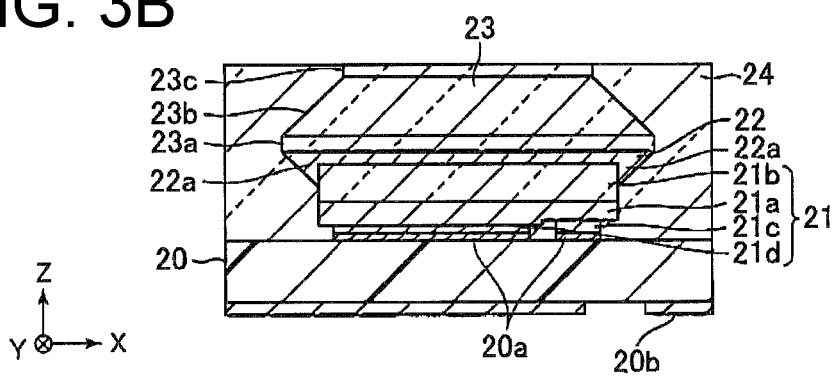

FIGS. 3A and 3B are a schematic perspective view and a cross-sectional view taken along the X axis direction, respectively, of a semiconductor light emitting device according to a second exemplary embodiment.

The semiconductor light emitting device according to the second exemplary embodiment can be configured to include a mounting substrate 20, an LED element 21 disposed on or above the mounting substrate 20, a phosphor ceramic plate 23 disposed on or above the LED element 21 with a transparent adhesive layer 22 interposed therebetween, and a light reflecting member 24.

The mounting substrate 20 may be a flip-chip mounting substrate, and has a front surface wiring 20a and a back surface wiring 20b provided on the front surface and the back surface, respectively.

The LED element 21 can be an LED element of a top and side emission type in which a semiconductor layer 21a is grown using a transparent sapphire substrate 21b as a growth substrate. The semiconductor layer 21a may be configured to include, in order from the sapphire substrate 21b side, an n-type semiconductor layer formed of n-type GaN doped with Si or the like, an active layer (light emitting layer) having a multiquantum well structure including a well layer formed of InGaN and a barrier layer formed of GaN, and a p-type semiconductor layer formed of p-type GaN doped with Mg or the like.

Thus, the LED element 21 can be configured to include the sapphire substrate 21b, the semiconductor layer 21a disposed on the sapphire substrate 21b, an n-side electrode 21c electrically connected to the n-type semiconductor layer of the semiconductor layer 21a, and a p-side electrode 21d electrically connected to the p-type semiconductor layer of the semiconductor layer 21a.

The shape of the LED element 21 when viewed in a plan view (the shape of the upper surface of the sapphire substrate 21b) may be, for example, a rectangle.

In the second exemplary embodiment, a plurality of (two) LED elements 21 are mounted on the mounting substrate 20 along the Y-axis direction. Specifically, the n-side electrode 21c and the p-side electrode 21d of the LED element 21 are electrically connected to the surface wiring 20a of the mounting substrate 20 using Au bumps or the like, and simultaneously are mechanically fixed.

When a current is supplied to the semiconductor layer 21a through the surface wiring 20a of the mounting substrate 20, blue light is emitted from the semiconductor layer 21a serving as a light emitting layer. The blue light can thus be emitted from the upper surface and the side surfaces of the LED element 21.

The phosphor ceramic plate 23 can be bonded to the upper surface of the LED element 21, i.e., the upper surface of the sapphire substrate 21b, via the transparent adhesive layer 22. In this exemplary embodiment, the transparent adhesive layer 22 is not only disposed between the upper surface of the LED element 21 and the phosphor ceramic plate 23, but also disposed in a region extending from the upper surface thereof to the side surface of the LED element 21.

In joining the phosphor ceramic plate 23, a transparent adhesive may be applied to the upper surface of the sapphire substrate 21b in an amount larger than that required for bonding, and the phosphor ceramic plate 23 is placed thereon. In this manner, the transparent adhesive protrudes from the region immediately above the upper surface of the sapphire substrate 21b, so that the transparent adhesive layer 22 is formed so as to be connected from the upper surface to the side surface of the sapphire substrate 21b. A portion of the cured transparent adhesive (transparent adhesive layer 22) formed in the side surface region of the sapphire substrate 21b is referred to as a fillet portion 22a.

The phosphor ceramic plate 23 may be a light transmissive wavelength conversion member produced by high-temperature firing of alumina and a YAG phosphor material, for example.

Figure 3C:
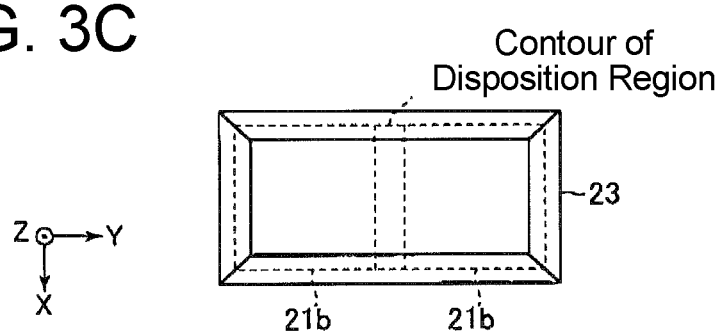
FIG. 3C is a schematic plan view illustrating the contour of the disposition region of a phosphor ceramic plate 23 and a sapphire substrate 21b of two LED elements 21.

The lower surface of the phosphor ceramic plate 23 can have a rectangular shape, for example. The size thereof is made larger than the contour (rectangular shape defined by the light emitting portions of the two LED elements 21) of the disposition region of the sapphire substrates 21b (the light emitting portions of the LED elements 21) of the two LED elements 21 when viewed in a plan view, as illustrated in FIG. 3C. The upper surface of the phosphor ceramic plate 23 may have a rectangular shape, for example. The size thereof is made smaller than the size of the contour of the disposition region of the sapphire substrates 21b of the two LED elements 21 (the light emitting portions of the LED elements 21).

The phosphor ceramic plate 23 can be configured to include, in order from the LED element 21 side, a rectangular parallelepiped portion (vertical portion) having vertical surfaces 23a as four side surfaces, a truncated quadrangular pyramid portion (inclined portion) having inclined surfaces 23b as four side surfaces, and a rectangular parallelepiped portion (vertical portion) having vertical surfaces 23c as four side surfaces. The vertical surfaces 23a and 23c are vertical side surfaces that erect (extend) vertically (Z-axis positive direction) from the lower surface, and the inclined surfaces 23b are inclined side surfaces that erect (extend) from the lower surface while being inclined inward (center side of the phosphor ceramic plate 23) at a predetermined angle.

The phosphor ceramic plate 23 can be disposed such that, in a plan view, the lower surface thereof includes the contour of the disposition region of the sapphire substrates 21b (the light emitting portions of the LED elements 21) of the two LED elements 21, and the upper surface thereof is included in the contour of the disposition region of the sapphire substrates 21b (the light emitting portions of the LED elements 21) of the two LED elements 21, for example.

The light reflecting member 24 can be disposed to cover the side surfaces of the LED element 21, the transparent adhesive layer 22, and the phosphor ceramic plate 23, and can have a function of sealing the LED element 21, the transparent adhesive layer 22, and the phosphor ceramic plate 23 as well as a light reflection function.

The light reflecting member 24 can be formed using the same material as that of the light reflecting member 14 of the first exemplary embodiment. The height of the upper surface of the light reflecting member 24 is equal to the height of the upper surface of the phosphor ceramic plate 23.

The blue light emitted from the upper surfaces and the side surfaces of the LED elements 21 can enter the phosphor ceramic plate 23. At this time, the blue light emitted from the side surfaces of the LED elements 21 can be reflected by, for example, the interface between the fillet portion 22a of the transparent adhesive layer 22 and the light reflecting member 24, and can enter the lower surface of the phosphor ceramic plate 23 with high efficiency.

Part of the blue light incident on the phosphor ceramic plate 23 can enter the phosphor material to be converted into light of a different wavelength (e.g., yellow light), and be emitted to the outside from the upper surface of the phosphor ceramic plate 23 (light emitting surface of the semiconductor light emitting device) together with another part of blue light which has not been incident on the phosphor material. Thus, white light can be obtained by yellow light which has been incident on the phosphor material and emitted from the phosphor ceramic plate 23 after wavelength conversion, and blue light which has exited from the phosphor ceramic plate 23 without entering the phosphor material (without wavelength conversion).

Of the light having entered the phosphor ceramic plate 23, the light that has traveled to the side surfaces of the phosphor ceramic plate 23 can be reflected by the interface between the side surface of the phosphor ceramic plate 23 and the light reflecting member 24.

The light reflecting member 24 can suppress light leakage from a portion other than the upper surface of the phosphor ceramic plate 23, i.e., the light emitting surface of the semiconductor light emitting device. In addition, the light extraction efficiency of the semiconductor light emitting device can be improved.

The semiconductor light emitting device according to the second exemplary embodiment can have the transparent adhesive layer 22 including the fillet portion 22a, and in the vicinity of the lower surface of the phosphor ceramic plate 23, also have the vertical portion having the size larger than the size of the contour of the disposition region of the sapphire substrates 21b of the two LED elements 21 when viewed in a plan view. Therefore, light emitted from the LED elements 21 can be introduced into the phosphor ceramic plate 23 with high efficiency.

In addition, since the phosphor ceramic plate 23 is provided with the inclined portion, the upper surface of the phosphor ceramic plate 23 becomes smaller than the lower surface. The light emitted by the LED elements 21 and introduced into the phosphor ceramic plate 23 can travel straight, or be reflected at the interface between the inclined surface 23b and the light reflecting member 24, so as to travel toward the upper surface of the phosphor ceramic plate 23. Since the size of the upper surface of the phosphor ceramic plate 23, i.e., the size of the light emitting surface of the semiconductor light emitting device, is smaller than the size of the contour of the disposition region of the sapphire substrates 21b of the two LED elements 21, the luminance of the light emitted from the semiconductor light emitting device can be improved. Also, in the semiconductor light emitting device according to the second exemplary embodiment, the size of the light emitting surface of the semiconductor light emitting device can be reduced without reducing the size of the LED element, and high luminance can be realized.

Further, in manufacturing the semiconductor light emitting device according to the second exemplary embodiment, after the LED elements 21 are mounted on the mounting substrate 20, the phosphor ceramic plate 23 can be bonded on or above the LED elements 21 using a transparent adhesive. After that, for example, a frame material may be disposed around the mounting substrate 20, and a liquid resin material such as a resin material containing a powder of a light-reflecting material may be injected into the inside of the frame material, followed by curing the resin material, to thereby form the light-reflecting member 24.

Also in the semiconductor light emitting device according to the second exemplary embodiment, since the vertical portion (the rectangular parallelepiped portion having the vertical surfaces 23c as side surfaces) is provided in the vicinity of the upper surface of the phosphor ceramic plate 23, when the light reflecting member 24 is formed on the side surfaces by filling and curing the liquid resin material, the height of the liquid material can be reliably controlled to the height of the upper surface of the phosphor ceramic plate 23, and the liquid material can be prevented from covering the upper surface of the phosphor ceramic plate 23. In the manufactured semiconductor light emitting device, the height of the upper surface of the light reflecting member 24 can be equal to the height of the upper surface of the phosphor ceramic plate 23, so that the stability of the shape and size of the semiconductor light emitting device can be realized.

As in the first exemplary embodiment, the vertical portions in the vicinity of the upper surface and the lower surface of the phosphor ceramic plate 23 can be controlled to have a desired shape and size by, for example, cutting. In this respect, instability of the shape and size of the phosphor ceramic plate 23 can be suppressed, and stability of the shape and size of the semiconductor light emitting device can be improved.

The vertical portion in the vicinity of the upper surface of the phosphor ceramic plate 23 can also contribute to suppression of leakage or blurring of outgoing light of the semiconductor light emitting device.

Further, the provision of the vertical portion to the phosphor ceramic plate 23 in the vicinity of the lower surface thereof can exert an effect that when the phosphor ceramic plate 23 is bonded onto the LED element 21, the transparent adhesive hardly overlaps the side surfaces of the phosphor ceramic plate 23. In addition, chipping and the like are less likely to occur, and therefore, shape stability of the semiconductor light emitting device can be realized from this point as well.

Thus, the semiconductor light emitting device of the second exemplary embodiment can have a high quality.

Although the second exemplary embodiment is configured as the semiconductor light emitting device in which one phosphor ceramic plate 23 is disposed on a plurality (two) of LED elements 21 mounted on the mounting substrate 20, a single LED element 21 may be mounted on the mounting substrate 20 (chip size package). In this case, the size of the lower surface of the phosphor ceramic plate 23 is made larger than the size of the upper surface of the light emitting portion of the LED element 21, i.e., the sapphire substrate 21b, meaning that the size of the lower surface of the phosphor ceramic plate 23 is made larger than the size of the contour of the light emitting portion of the single LED element 21. Furthermore, the size of the upper surface of the phosphor ceramic plate 23 is made smaller than the size of the upper surface of the light emitting portion of the LED element 21, i.e., the sapphire substrate 21b, meaning that the size of the upper surface of the phosphor ceramic plate 23 is made smaller than the size of the contour of the disposition region of the light emitting portion of the single LED element 21. Further, the phosphor ceramic plate 23 is disposed such that, in a plan view, the lower surface thereof includes the light emitting portion of the LED element 21 (sapphire substrate 21b) and the upper surface thereof is included in the light emitting portion of the LED element 21 (sapphire substrate 21b).

It should be noted that the disposition mode in which the phosphor ceramic plate 23 is disposed such that, for example, the upper surface is included in the contour of the disposition region of the sapphire substrate 21b of the LED element 21, i.e., the light emitting portion of the LED element 21, in a plan view is not essential.

Figure 4:
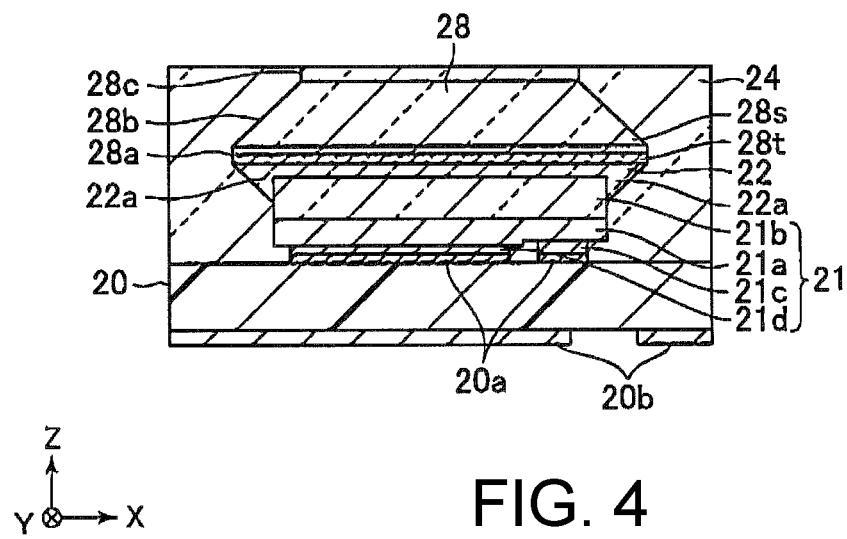
FIG. 4 is a schematic cross-sectional view illustrating a semiconductor light emitting device using a wavelength conversion member 28 instead of the phosphor ceramic plate 23 in the semiconductor light emitting device according to the second exemplary embodiment.

FIG. 4 is a schematic cross-sectional view illustrating a semiconductor light emitting device using a wavelength conversion member 28 having the same configuration as the wavelength conversion member 18 illustrated in FIG. 2 in place of the phosphor ceramic plate 23 in the semiconductor light emitting device according to the second exemplary embodiment.

The wavelength conversion member 28 may have, for example, the same shape as that of the phosphor ceramic plate 23, and be configured to include a light transmissive member 28s and a wavelength conversion layer 28t disposed on the lower surface of the light transmissive member 28s. The wavelength conversion member 28 can be also a light transmitting member including a wavelength conversion material in a part thereof, specifically, a part where the wavelength conversion layer 28t is to be provided.

Also in the wavelength conversion member 28, a rectangular parallelepiped portion (vertical portion) having vertical surfaces 28a as side surfaces can be composed of a part of the light transmissive member 28s and the wavelength conversion layer 28t, and a truncated quadrangular pyramid portion (inclined portion) having inclined surfaces 28b as side surfaces and a rectangular parallelepiped portion (vertical portion) having vertical surfaces 28c as side surfaces are composed of another part of the light transmissive member 28s.

The semiconductor light emitting device using the wavelength conversion member 28 in place of the phosphor ceramic plate 23 can also exhibit the same effects as those of the second exemplary embodiment. Furthermore, the wavelength conversion layer 28t can have a high density, so that light with high luminance can be emitted, while the light can be diffused and/or reflected within the light transmissive member 28s advantageously.

Next, with reference to FIGS. 5A to 5E, a description will be given of a method of processing the shape of the side surface of the phosphor ceramic plate 13 used in the semiconductor light emitting device according to the first exemplary embodiment. The side surfaces of the phosphor ceramic plate 23 used in the semiconductor light emitting device according to the second exemplary embodiment, the wavelength conversion members 18 and 28 illustrated in FIGS. 2 and 4, and the phosphor ceramic plate 13' illustrated in FIG. 2B can be processed in the same manner as that in this exemplary embodiment.

Figure 5A:
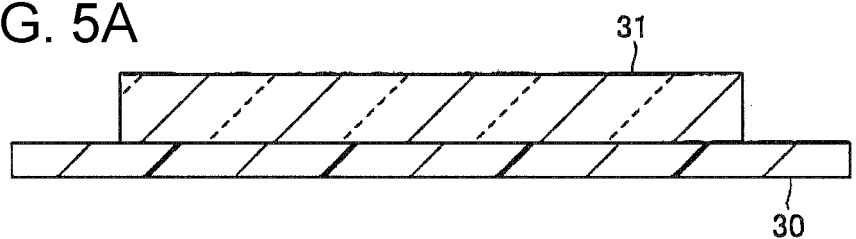
FIGS. 5A to 5E are schematic cross-sectional views showing a method of processing a side surface shape of the phosphor ceramic plate 13 used in the semiconductor light emitting device according to the first exemplary embodiment.

First, with reference to FIG. 5A, a phosphor ceramic plate 31 is disposed on a dicing tape 30.

Figure 5B:
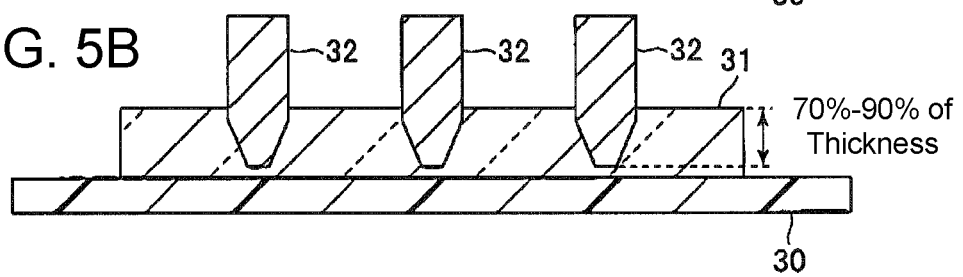

Next with reference to FIG. 5B, a dicing blade 32 is used to cut the phosphor ceramic plate 31. Herein, the dicing blade 32 may have an inclined side surface at a tip portion thereof adjusted to an inclination angle of the inclined surfaces 13b of the phosphor ceramic plate 13. Further, the dicing blade 32 may be formed so that the top of the tip portion is made flat, whereby the half cut and the cutting depth can be set to desired values. In the step illustrated in FIG. 5B, a cut can be made to a depth of 70% to 90% of the thickness of the phosphor ceramic plate 31. More specifically, the top (flat portion) of the tip portion of the dicing blade 32 is brought to reach a portion that is in the vicinity of the middle of the vertical portion (vertical surface 13a) of the phosphor ceramic plate 13, thereby leaving a thin-walled portion.

Figure 5C:
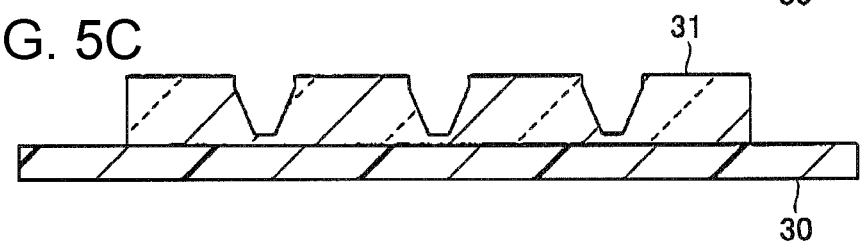

Next with reference to FIG. 5C, side surfaces corresponding to the vertical portion (vertical surface 13c) and the inclined portion (inclined surface 13b) of the phosphor ceramic plate 13 are formed in the cut portion. The vertical surface 13c can be formed by the vertical side surface of the dicing blade 32, and the inclined surface 13b can be formed by the inclined side surface of the dicing blade 32.

Figure 5D:
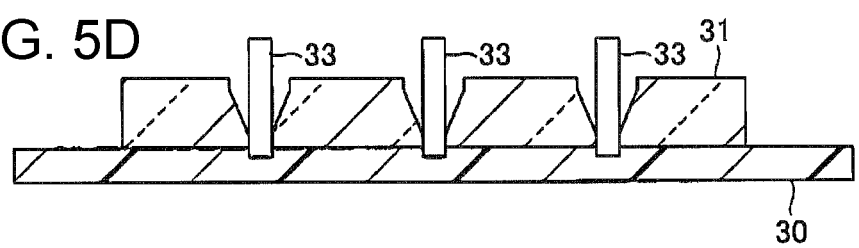
Figure 5E:
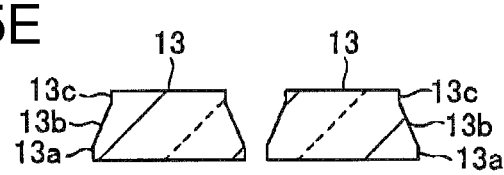

With reference to FIGS. 5D and 5E, a dicing blade 33 for vertical cutting is used to perform vertical full cutting and singulation. The vertical surface 13a of the phosphor ceramic plate 13 can be formed by the side surface of the dicing blade 33.

The vertical portions (vertical surfaces 13a and 13c) and the inclined portion (inclined surface 13b) of the phosphor ceramic plate 13 can be arbitrarily dimensioned by adjusting the thickness of the dicing blades 32 and 33, the angle of the inclined side surface, and the width of the top or a flat portion. Furthermore, the vertical portion (vertical surfaces 13a'), inclined portion (inclined surfaces 13b'), and vertical portion (vertical surfaces 13c') can be produced to have respective desired dimensions using another dicing blade having a rounded tip adjusted by means of the steps of FIGS. 5A to 5E.

A description will now be given of semiconductor light emitting devices according to modified examples with reference to FIGS. 6A to 6D.

The phosphor ceramic plates 13 and 23 and the wavelength conversion members 18 and 28 illustrated in FIGS. 2 and 4 used in the semiconductor light emitting devices according to the first and second exemplary embodiments have the inclined surfaces 13b, 23b, 18b, and 28b in which all four side surfaces are inclined at an equal inclination angle, but the inclination angle may not be uniform for each of the inclined surfaces 13b, 23b, 18b, and 28b.

Figure 6A:
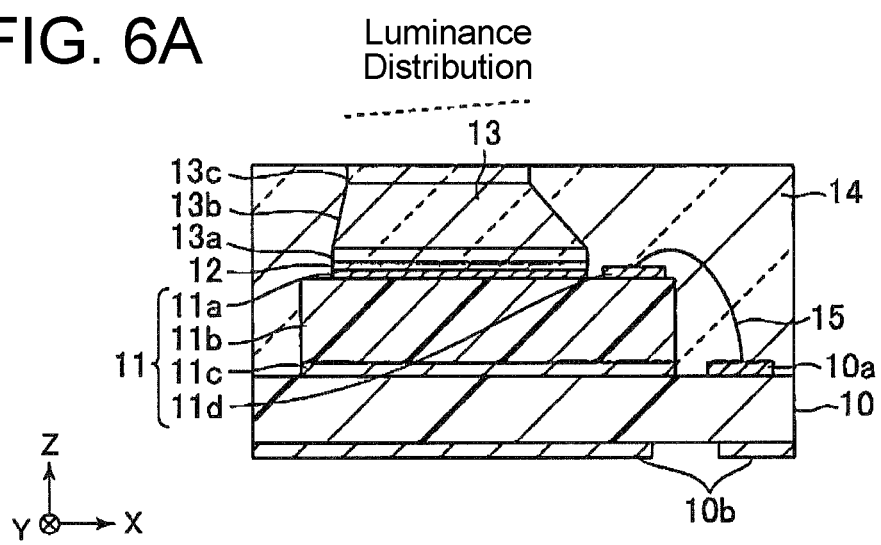
FIGS. 6A, 6B, 6C, and 6D are each a schematic cross-sectional view illustrating a semiconductor light emitting device according to a modified example.

FIG. 6A illustrates an example in which the opposing inclined side surfaces 13b of the phosphor ceramic plate 13 used in the semiconductor light emitting device according to the first exemplary embodiment are changed to be inclined at mutually different angles. In the example illustrated in FIG. 6A, the inclination angle (inclination angle with respect to the horizontal plane (XY plane)) of the side surface 13b on the X-axis negative direction side is made large whereas the inclination angle of the side surface 13b on the X-axis positive direction side is made small.

Figure 6B:
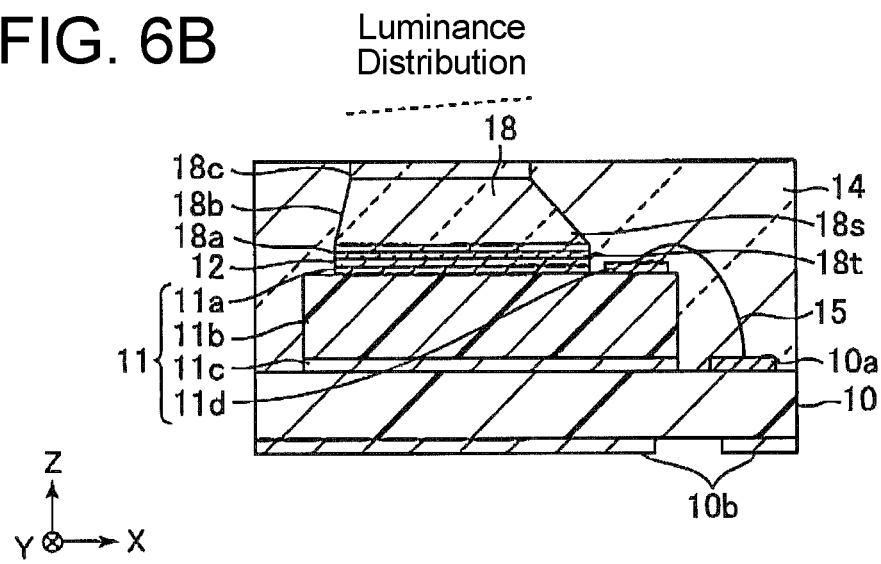
Figure 6C:
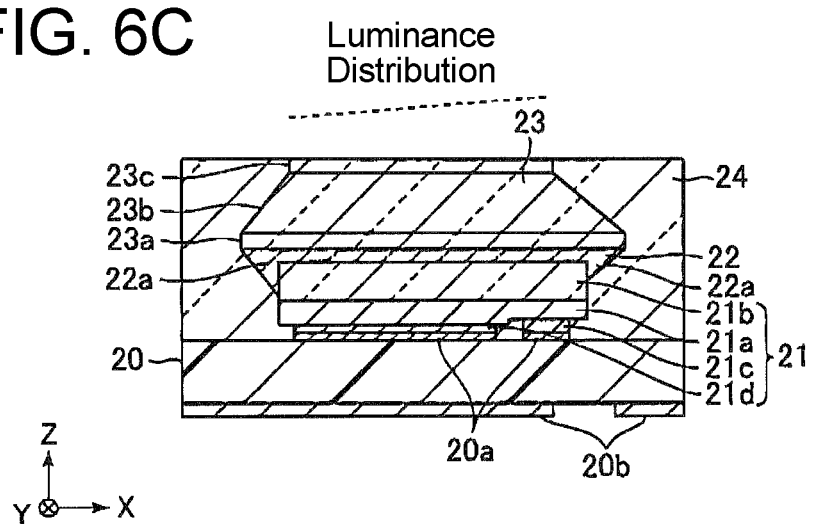
Figure 6D:
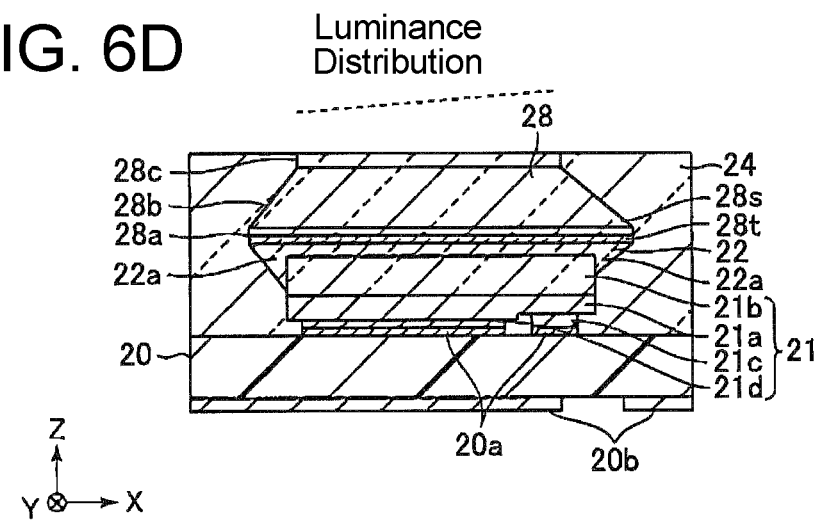

FIGS. 6B, 6C, and 6D illustrate examples in which the inclination angles of the inclined surfaces 18b, 23b, and 28b of the wavelength conversion member 18 illustrated in FIG.

2, the phosphor ceramic plate 23 used in the semiconductor light emitting device according to the second exemplary embodiment, and the wavelength conversion member 28 illustrated in FIG. 4 are not uniform, respectively. Also, in the examples illustrated in FIGS. 6B, 6C, and 6D, the inclination angles of the side surfaces 18b, 23b, and 28b on the X-axis negative direction side are made large whereas the inclination angles of the side surfaces 18b, 23b, and 28b on the X-axis positive direction side are made small.

By varying the inclination angle, distribution of luminance of light emitted from the semiconductor light emitting device can be designed. In the examples illustrated in FIGS. 6A to 6D, a luminance distribution can be designed such that the luminance on the side with a small inclination angle (the X-axis positive direction side) is relatively high and the luminance on the side with a large inclination angle (the X-axis negative direction side) is relatively low, for example, resulting in the luminance distribution in which luminance increases from the X-axis negative direction side toward the X-axis positive direction side.

The semiconductor light emitting device having a luminance gradient in the outgoing light can be suitably used, for example, in a headlamp for an automobile. When light distribution of a headlamp for an automobile is formed, the luminance of a hot region (a light/dark boundary portion of the center portion of a passing beam light distribution) can be improved, so that the distance visibility can be remarkably improved.

FIGS. 7A, 7B, 7C, and 7D are each a schematic cross-sectional view illustrating a semiconductor light emitting device according to a modified example.

As illustrated in FIGS. 7A to 7D, it is also possible to use phosphor ceramic plates 13 and 23, and wavelength conversion members 18 and 28, each of which has a part of its side surface as a vertical surface (not having an inclined surface). In the modified examples illustrated in FIGS. 7A to 7D, the side surface on the X-axis negative direction side is made as a vertical surface.

In the modified examples shown in FIGS. 7A to 7D, the distribution of the luminance of the light emitted from the semiconductor light emitting device can also be designed. Specifically, a luminance distribution can be designed such that the luminance on the side (X-axis positive direction side) including the inclined surfaces 13b, 18b, 23b, and 28b is relatively high, and the luminance on the side (X-axis negative direction side) including a vertical surface is relatively low, for example, resulting in the luminance distribution in which luminance increases from the X-axis negative direction side toward the X-axis positive direction side. The semiconductor light emitting device illustrated in FIGS. 7A to 7D can also be suitably used, for example, in a headlamp for an automobile. As discussed above, it is suitable, for example, for forming a light distribution at a light/dark boundary (cut-off line).

Figure 7A:
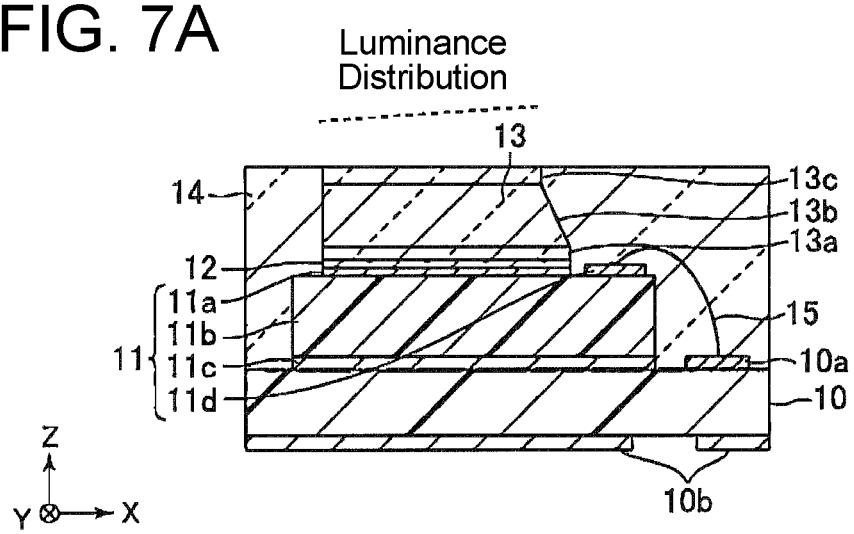
FIGS. 7A, 7B, 7C, and 7D are each a schematic cross-sectional view illustrating a semiconductor light emitting device according to a modified example.
Figure 7B:
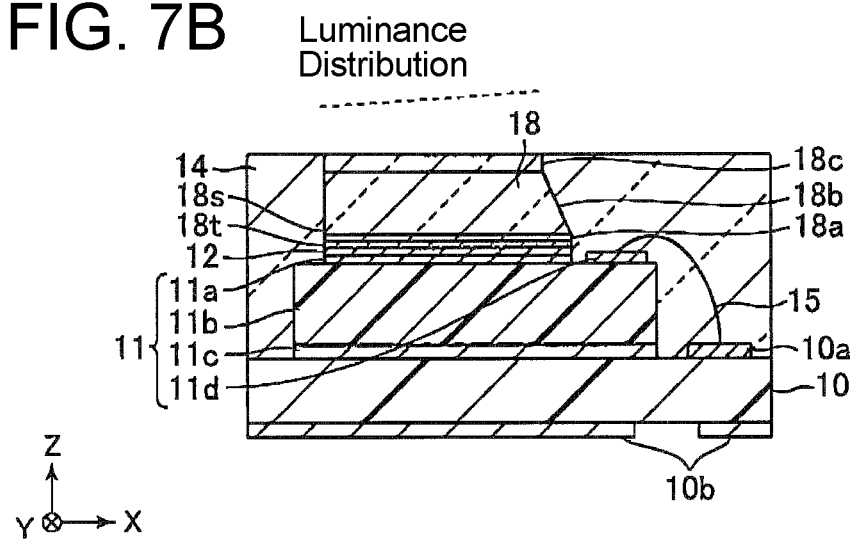
Figure 7C:
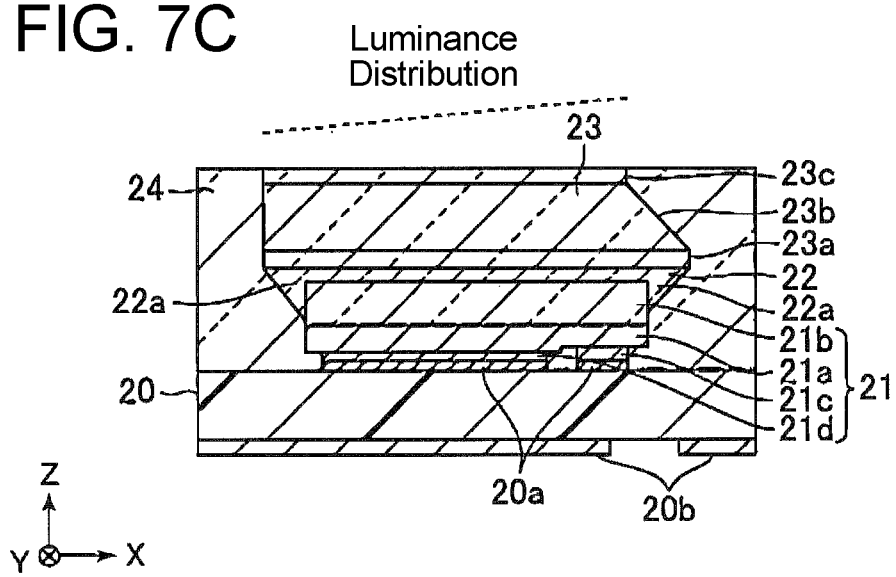
Figure 7D:
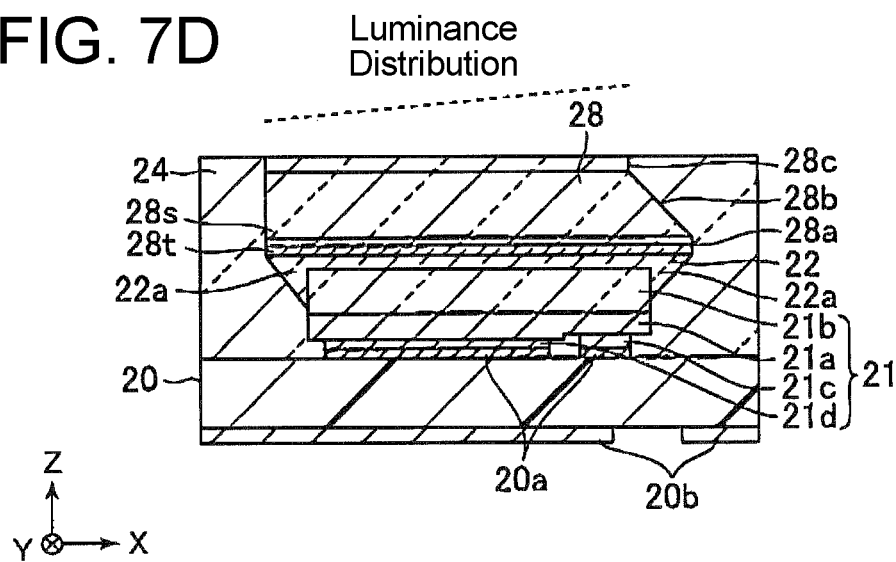

Also, in the modified examples illustrated in FIGS. 7C and 7D, the sizes of the upper surfaces of the phosphor ceramic plate 23 and the wavelength conversion member 28 (the light emitting surface of the semiconductor light emitting device) are made smaller than the sizes of the contour of the disposition region of the sapphire substrates 21b of the two LED elements 21.

Figures 8A, 8B:
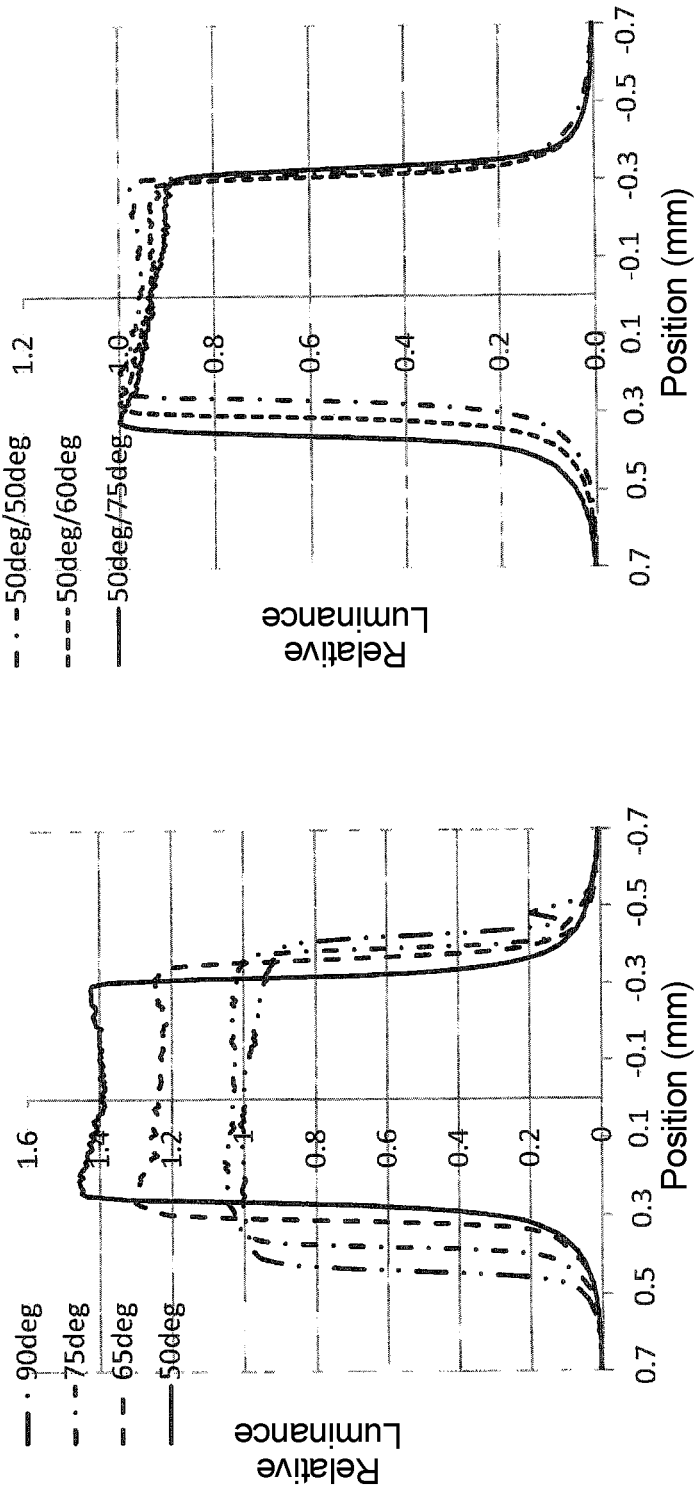
FIGS. 8A and 8B are graphs showing the difference in luminance distribution according to the inclination angle of the inclined surface 13b.

FIGS. 8A and 8B are graphs showing a difference in luminance distribution (luminance distribution of light emitted from the semiconductor light emitting device) according to the inclination angle (inclination angle with respect to the horizontal plane (XY plane)) of the inclined surface 13b. The horizontal axis of the graphs in both figures represents the position in the lateral direction (X-axis direction) of the light emitting surface (the upper surface of the phosphor ceramic plate 13) of the semiconductor light emitting device in units of "mm", and the vertical axis represents the relative luminance.

FIG. 8A shows a case where the inclination angle of the inclined surface 13b was changed in the semiconductor light emitting device according to the first exemplary embodiment illustrated in FIGS. 1A to 1C. The phosphor ceramic plate 13 having different inclination angles of the inclined surfaces 13b was processed by using a dicing blade 32 having different inclination side angles of the tips (see FIG. 5B). In this graph, the outgoing light luminance distributions of the semiconductor light emitting devices in which the inclination angles of the inclined surface 13b were 90°, 75°, 65°, and 50° are shown. In accordance with the inclination angles (90°, 75°, 65°, or 50°) of the inclined surface 13b, the size of the upper surface of the phosphor ceramic plate 13 in the lateral direction is 0.98 mm, 0.96 mm, 0.84 mm, or 0.75 mm, respectively. The graph of the inclination angle of 90° is the luminance distribution of the comparative example in which the side surface is a vertical surface.

When the inclination angle of the inclined surface 13b is 90°, 75°, 65°, or 50°, the relative luminance of the light emitted from the semiconductor light emitting device at the center in the lateral direction (0 mm position) is 1.00, 1.03, 1.24, or 1.40. From the results in the graph, it can be seen that when the inclination angle of the inclined surface 13b becomes small, i.e., the upper surface size of the phosphor ceramic plate 13 becomes small, the outgoing light luminance of the semiconductor light emitting device becomes high.

FIG. 8B shows a case where the combination of the inclination angles of the inclined surfaces 13b is changed in the semiconductor light emitting device according to the modified example illustrated in FIG. 6A. This graph shows the outgoing light luminance distribution of the semiconductor light emitting device in which the combination of the inclination angles of the inclined surface 13b (the inclination angle of the inclined surface on the X-axis negative direction side/the inclination angle of the inclined surface on the X-axis positive direction side) is 50°/50°, 60°/50°, and 75°/50°. Note that the graph of 50°/50° of the combination of the inclination angles is the luminance distribution of the outgoing light in the semiconductor light emitting device having the configuration illustrated in FIGS. 1A to 1C.

From the results in the graph, it can be seen that when there is a difference in the combination of the inclination angles, i.e., the inclination angles of the inclined surfaces 13b opposite to each other in the X-axis direction, the luminance gradient is formed along the X-axis direction, and that the luminance gradient increases as the difference increases.

Figure 9A:
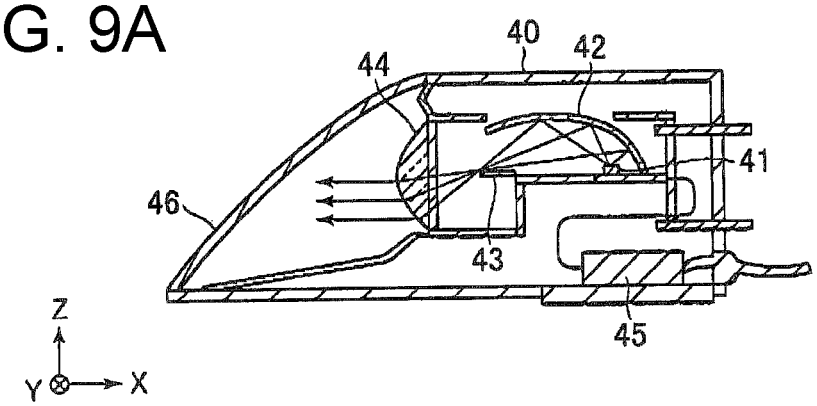
FIG. 9A is a schematic cross-sectional view showing a bi-beam LED headlamp.

FIG. 9A is a schematic cross-sectional view of a bi-beam LED headlamp for an automobile headlamp.

The headlamp may be configured to include, disposed in a housing 40 for example, an LED light source 41, a reflector 42, a shade 43, a projection lens 44, a power source 45, and an outer lens 46 fitted to and disposed in the housing 40.

As the LED light source 41, for example, a semiconductor light emitting device according to the exemplary embodiment or the modified example in which the number of LED elements arranged in the Y-axis direction is increased can be used. As described above, the semiconductor light emitting device according to the exemplary embodiment and the modified example can emit light with high luminance. Furthermore, such a semiconductor light emitting device can have a small light emitting surface and the constituent members of the optical system including the lens which can be miniaturized. From the viewpoint of these features as well as the easy provision of the luminance gradient in the outgoing light, the semiconductor light emitting device according to the exemplary embodiment and the modified example can be suitably used for a light source of a headlamp for an automobile.

Figure 9B:
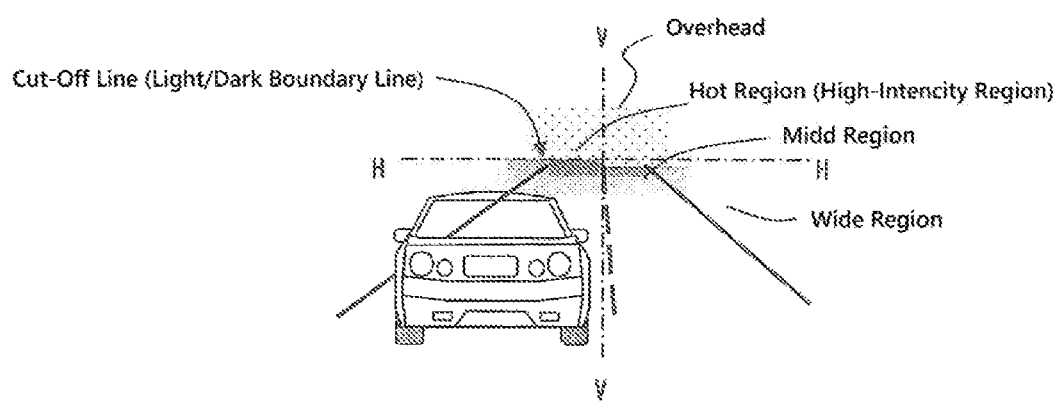
FIGS. 9B and 9C are schematic views showing a passing beam light distribution and a traveling beam light distribution, respectively.
Figure 9C:
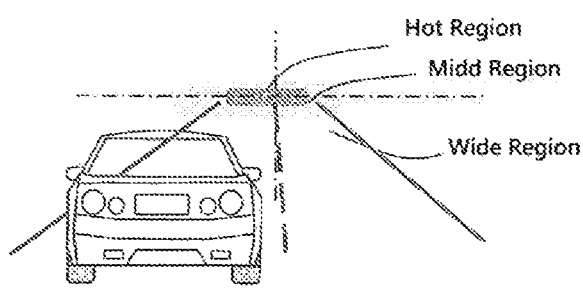

With this configuration, when a current is supplied by the power source 45, white light can be emitted from the LED light source 41. The emitted white light can be reflected by the reflector 42, transmitted through the projection lens 44 and the outer lens 46, and irradiated to the front of the vehicle. When a movable shade 43 is used, the passing beam light distribution (see FIG. 9B) and the traveling beam light distribution (see FIG. 9C) can be switched by a single lamp of the LED light source 41. The shade 43 can be configured to shield light directed above the cut-off line (light/dark boundary portion in the light distribution pattern), thereby realizing a passing beam light distribution.

The presently discloses subject matter has been described by way of the exemplary embodiments and modified examples, but is not limited thereto.

For example, although an LED element is used as the semiconductor light emitting element in the exemplary embodiments and the modified examples, various semiconductor light emitting elements such as a laser diode (LD) element and the like can be used without being limited to the LED element.

In addition, the exemplary embodiments and the modified examples have been illustrated with the configuration in which the light transmitting member (the phosphor ceramic plate 13, the wavelength conversion member 18, etc.) including the wavelength conversion material at least in part thereof has an inclined surface on both the side surfaces in the longitudinal direction (Y-axis direction) and the side surfaces in the short direction (X-axis direction). However, a configuration in which the inclined surface is provided only on one of the side surfaces in either the longitudinal direction and the short direction, for example, only on the side surfaces in the short direction (both the two side surfaces in the other direction are vertical surfaces) may be employed. Furthermore, the inclined surface may be provided on a part of the side surface instead of the entire side surface. A configuration in which the inclined surface is provided on a part of one side surface may be employed.

The light transmitting member including the wavelength conversion material in at least part thereof can be configured by the first part having the side surfaces all being a vertical surface, the second part disposed on the first part and including an inclined surface on at least part of the side surfaces, and the third part disposed on the second part and having the side surfaces all being a vertical surface, in order from the semiconductor light emitting device side. The size of the upper surface of the third portion is made smaller than the size of the lower surface of the first portion.

Note that the inclined surface is not limited to a flat surface, and may include a curved surface. For example, a configuration including a curved surface concave inward or a curved surface convex outward may be employed.

Further, in the wavelength conversion members 18 and 28 illustrated in FIG. 2, FIG. 4, and the like, the rectangular parallelepiped portion (vertical portion) having the vertical surfaces 18a, 28a as side surfaces is composed of a part of the light transmissive member 18s, 28s and the wavelength conversion layer 18t, 28t, but may be composed only of the wavelength conversion layer 18t, 28t.

The semiconductor light emitting device according to the exemplary embodiments and the modified examples can be suitably used as a vehicle lighting fixture, such as a headlamp for an automobile.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light emitting device comprising:
   a semiconductor light emitting element; and
   a light transmitting member disposed on or above the semiconductor light emitting element, the light transmitting member being configured to include a wavelength conversion material at least in part,
   the light transmitting member comprising: in order, from a side of the semiconductor light emitting element, a first portion having side surfaces all being respective vertical surfaces that are vertical with respect to a horizontal lower surface of the first portion; a second portion disposed on the first portion and having side surfaces at least part of which includes an inclined surface that is inclined relative to the vertical surfaces of the first portion; and a third portion disposed on the second portion and having side surfaces all being respective vertical surfaces that are vertical with respect to the horizontal lower surface of the first portion, wherein
   the third portion has an upper surface of which a size is smaller than a size of the horizontal lower surface of the first portion.

2. The semiconductor light emitting device according to claim 1, wherein
   the semiconductor light emitting element includes a light emitting layer disposed in a disposition region having a contour with a shape and a size, and
   the first portion of the light transmitting member has the lower surface of which a shape and the size are equivalent to the shape and the size of the contour of the disposition region of the light emitting layer of the semiconductor light emitting element when viewed in a plan view.

3. The semiconductor light emitting device according to claim 1, wherein
   the semiconductor light emitting element includes a light emitting portion disposed in a disposition region having a contour with a size,
   the size of the lower surface of the first portion of the light transmitting member is larger than the size of the contour of the disposition region of the light emitting portion of the semiconductor light emitting element,
   the size of the upper surface of the third portion of the light transmitting member is smaller than the size of the contour of the disposition region of the light emitting portion of the semiconductor light emitting element,
   the light transmitting member is disposed on the semiconductor light emitting element via a transparent adhesive layer, and
   the transparent adhesive layer is formed so as to be connected from a portion between the semiconductor light emitting element and the light transmitting member to a side surface of the semiconductor light emitting element to form a fillet portion in a region of the side surface of the semiconductor light emitting element.

4. The semiconductor light emitting device according to claim 1, wherein
the light transmitting member includes a light transmissive member and a wavelength conversion layer disposed on a lower surface of the light transmissive member,
the light transmissive member is composed by the second portion and the third portion, and
the wavelength conversion layer is composed by at least a part of the first portion.

5. The semiconductor light emitting device according to claim 2, wherein
the light transmitting member includes a light transmissive member and a wavelength conversion layer disposed on a lower surface of the light transmissive member,
the light transmissive member is composed by the second portion and the third portion, and
the wavelength conversion layer is composed by at least a part of the first portion.

6. The semiconductor light emitting device according to claim 3, wherein
the light transmitting member includes a light transmissive member and a wavelength conversion layer disposed on a lower surface of the light transmissive member,
the light transmissive member is composed by the second portion and the third portion, and
the wavelength conversion layer is composed by at least a part of the first portion.

7. The semiconductor light emitting device according to claim 1, wherein
the second portion of the light transmitting member has side surfaces opposite to each other and inclined at mutually different inclination angles.

8. The semiconductor light emitting device according to claim 2, wherein
the second portion of the light transmitting member has side surfaces opposite to each other and inclined at mutually different inclination angles.

9. The semiconductor light emitting device according to claim 3, wherein
the second portion of the light transmitting member has side surfaces opposite to each other and inclined at mutually different inclination angles.

10. The semiconductor light emitting device according to claim 4, wherein
the second portion of the light transmitting member has side surfaces opposite to each other and inclined at mutually different inclination angles.

11. The semiconductor light emitting device according to claim 5, wherein
the second portion of the light transmitting member has side surfaces opposite to each other and inclined at mutually different inclination angles.

12. The semiconductor light emitting device according to claim 6, wherein
the second portion of the light transmitting member has side surfaces opposite to each other and inclined at mutually different inclination angles.

13. The semiconductor light emitting device according to claim 1, wherein
the light transmitting member has side surfaces of which a part is a vertical surface.

14. The semiconductor light emitting device according to claim 2, wherein
the light transmitting member has side surfaces of which a part is a vertical surface.

15. The semiconductor light emitting device according to claim 3, wherein
the light transmitting member has side surfaces of which a part is a vertical surface.

16. The semiconductor light emitting device according to claim 4, wherein
the light transmitting member has side surfaces of which a part is a vertical surface.

17. The semiconductor light emitting device according to claim 7, wherein
the light transmitting member has side surfaces of which a part is a vertical surface.

18. The semiconductor light emitting device according to claim 1, wherein
the semiconductor light emitting device is used as a light source for use in a headlamp of an automobile.

19. The semiconductor light emitting device according to claim 2, wherein
the semiconductor light emitting device is used as a light source for use in a headlamp of an automobile.

20. The semiconductor light emitting device according to claim 3, wherein
the semiconductor light emitting device is used as a light source for use in a headlamp of an automobile.

21. A semiconductor light emitting device comprising:
a semiconductor light emitting element; and
a light transmitting member disposed on or above the semiconductor light emitting element, the light transmitting member being configured to include a wavelength conversion material at least in part,
the light transmitting member comprising: in order from a side of the semiconductor light emitting element, a first portion having side surfaces all being respective vertical surfaces that are perpendicular relative to a top surface of the semiconductor light emitting element; a second portion disposed on the first portion and having side surfaces at least part of which includes a curved surface curved inwardly of the light transmitting member; and a third portion disposed on the second portion and having side surfaces continuous with the side surfaces of the second portion, all the side surfaces being closer to vertical surfaces than the side surfaces of the second portion, such that the curved surface of the second portion forms a concave surface extending from the vertical surfaces of the first portion to the side surfaces of the third portion, wherein
the third portion has an upper surface of which a size is smaller than a size of a lower surface of the first portion.

22. The semiconductor light emitting device according to claim 21, wherein
the semiconductor light emitting element includes a light emitting layer disposed in a disposition region having a contour with a shape and a size, and
the first portion of the light transmitting member has the lower surface of which a shape and the size are equivalent to the shape and the size of the contour of the disposition region of the light emitting layer of the semiconductor light emitting element when viewed in a plan view.

23. The semiconductor light emitting device according to claim 21, wherein the semiconductor light emitting element includes a light emitting portion disposed in a disposition region having a contour with a size, the size of the lower surface of the first portion of the light transmitting member is larger than the size of the contour of the disposition region of the light emitting portion of the semiconductor light emitting element, the size of the upper surface of the third portion of the light transmitting member is smaller than the size of the contour of the disposition region of the light emitting portion of the semiconductor light emitting element, the light transmitting member is disposed on the semiconductor light emitting element via a transparent adhesive layer, and the transparent adhesive layer is formed so as to be connected from a portion between the semiconductor light emitting element and the light transmitting member to a side surface of the semiconductor light emitting element to form a fillet portion in a region of the side surface of the semiconductor light emitting element.

24. The semiconductor light emitting device according to claim 21, wherein the light transmitting member includes a light transmissive member and a wavelength conversion layer disposed on a lower surface of the light transmissive member, the light transmissive member is composed by the second portion and the third portion, and the wavelength conversion layer is composed by at least a part of the first portion.

25. The semiconductor light emitting device according to claim 21, wherein the light transmitting member has side surfaces of which a part is a vertical surface.

26. A semiconductor light emitting device comprising:

a semiconductor light emitting element; and a light transmitting member disposed on or above the semiconductor light emitting element, the light transmitting member being configured to include a wavelength conversion material at least in part, the light transmitting member comprising: in order from a side of the semiconductor light emitting element, a first portion having side surfaces all being respective vertical surfaces; a second portion disposed on the first portion and having side surfaces at least part of which includes an inclined surface; and a third portion disposed on the second portion and having side surfaces all being respective vertical surfaces, the first portion, the second portion and the third portion being inseparable to form an integral body of the light transmitting member, wherein the third portion has an upper surface of which a size is smaller than a size of a lower surface of the first portion.

* * * * *